(12) United States Patent  
Ellingboe

(10) Patent No.: US 7,886,690 B2
(45) Date of Patent: Feb. 15, 2011

(54) PLASMA SOURCE

(75) Inventor: Albert Rogers Ellingboe, Malahide (IE)

(73) Assignee: Dublin City University, Dublin (IE)

( * ) Notice: Subject to any disclaimer, the term of this patent is extended or adjusted under 35 U.S.C. 154(b) by 454 days.

(21) Appl. No.: 11/914,111

(22) PCT Filed: May 11, 2006

(86) PCT No.: PCT/EP2006/062261

§ 371 (c)(1),
(2), (4) Date: Aug. 11, 2008

(87) PCT Pub. No.: WO2006/120239

PCT Pub. Date: Nov. 16, 2006

(65) Prior Publication Data

US 2008/0309242 A1     Dec. 18, 2008

Related U.S. Application Data

(63) Continuation-in-part of application No. 11/127,328, filed on May 11, 2005, now Pat. No. 7,342,361.

(30) Foreign Application Priority Data

May 11, 2005    (IE)    ................................. S2005/0301

(51) Int. Cl.
C23C 16/00    (2006.01)
C23F 1/00    (2006.01)
H05B 31/26    (2006.01)

(52) U.S. Cl. ............................. 118/723 E; 156/345.44; 315/111.21

(58) Field of Classification Search ............ 315/111.21, 315/111.31, 111.41, 111.51, 111.61; 118/723 E, 118/73 R, 723 I; 156/345.44, 345.45, 345.47
See application file for complete search history.

(56) References Cited

U.S. PATENT DOCUMENTS

| | | | |
|---|---|---|---|
| 5,330,615 A | 7/1994 | Chu | |
| 5,981,899 A | 11/1999 | Perrin et al. | |
| 6,020,686 A | 2/2000 | Ye et al. | |
| 6,183,605 B1 | 2/2001 | Schatz et al. | |
| 6,252,354 B1 * | 6/2001 | Collins et al. | ........... 315/111.51 |
| 6,375,860 B1 | 4/2002 | Ohkawa et al. | |

(Continued)

FOREIGN PATENT DOCUMENTS

DE    19928053 A1    1/2001

(Continued)

OTHER PUBLICATIONS

International Search Report and Written Opinion, mailed Sep. 25, 2006, relating to International Application No. PCT/EP2006/062261, 23 pages.

(Continued)

*Primary Examiner*—Douglas W Owens
*Assistant Examiner*—Minh D A
(74) *Attorney, Agent, or Firm*—Seed IP Law Group PLLC

(57) ABSTRACT

A plasma source is described. The source includes a reactive impedance element formed from a plurality of electrodes. By providing such a plurality of electrodes and powering adjacent electrodes out of phase with one another, it is possible to improve the characteristics of the plasma generated.

23 Claims, 8 Drawing Sheets

U.S. PATENT DOCUMENTS

| | | | |
|---|---|---|---|
| 6,632,322 B1 * | 10/2003 | Gottscho et al. | 156/345.33 |
| 6,884,635 B2 * | 4/2005 | Parsons | 438/10 |
| 6,962,664 B2 | 11/2005 | Mitrovic | |
| 7,342,361 B2 | 3/2008 | Ellingboe | |
| 7,520,244 B2 * | 4/2009 | Yamagishi et al. | 118/723 E |
| 2004/0168770 A1 | 9/2004 | Mitrovic et al. | |

FOREIGN PATENT DOCUMENTS

| | | |
|---|---|---|
| EP | 1094130 A2 | 4/2001 |
| EP | 2154704 A1 | 2/2010 |
| JP | 8124864 A | 5/1996 |
| JP | 2002313744 A | 10/2002 |
| WO | 9532315 A1 | 11/1995 |
| WO | 98/32154 A1 | 7/1998 |
| WO | 01/12350 A1 | 2/2001 |
| WO | 03015123 A2 | 2/2003 |

OTHER PUBLICATIONS

Boyle et al., "Independent control of ion current and ion impact energy onto electrodes in dual frequency plasma devices," J. Phys. D: Appl. Phys., 37:697-701, 2004.

* cited by examiner

405

400

A   B

PLASMA SOURCE

FIELD OF THE INVENTION

The present invention relates to plasma sources and in particular to a plasma source with reactive elements configured to be out of phase with one another so as to provide for controlled wavelength effects within the plasma process.

BACKGROUND

A plasma is an ionised gas that conducts electricity. In order to generate a plasma, an electrical field is applied to a contained gas, usually contained within a specifically designed chamber. In a vacuum chamber, where ions and electrons have long lifetimes, it is relatively easy to do this. Radio frequency (RF) power in the MHz range can be applied to two metal plates, or electrodes, immersed in the chamber, thereby creating a capacitive discharge. Alternatively, RF power may be deposited into a coil mounted on the chamber walls, thereby producing an inductively coupled plasma.

In the semiconductor industry, plasmas are used to deposit materials on and etch materials from workpieces that are typically semiconductor, dielectric and metal surfaces. This process is utilised so as to form specific electronic components on the substrate. A gas is introduced into a vacuum plasma processing chamber where the workpiece is located. The gas by undergoing an electrical breakdown forms a plasma in an excitation region using either an inductive source, where the antenna carries a current adjacent to the plasma window or a capacitive source which uses one (or more) electrode(s) with an oscillating voltage. Up until the early 1990's capacitive based systems were the preferred option but in the time period 1991 to 1995, inductive sources became more prevalent, and they continue to dominate in metal etch or poly etch applications. There are however problems with such inductive source plasmas in oxide etch applications. Furthermore, designs of inductive systems for oxide etch that provide the necessary performance and stability for manufacturing criteria results in the cost of an inductive based system being quite high.

Around 1998 the manufacturers of these systems, companies such as Lam Research Corporation and TEL started to refocus on capacitive systems so as to provide a cheaper and more reliable solution to the problems of plasma etching in this field. Further developments led to the reintroduction of capacitive systems at the expense of inductive systems. It is into this environment that dual frequency capacitive systems re-emerged as the preferred choice for oxide etch applications.

The reason for this trend towards dual frequency systems is that in a single frequency capacitive reactor, it is possible to increase the RF power to get higher ion bombardment energy, but the plasma density will also increase. These two parameters cannot be changed independently using a single frequency generator. In order to provide an additional degree of flexibility, more than one frequency of excitation of a capacitive plasma can be provided. A typical approach, such as that described in WO03015123, employs two separate power supplies (a high frequency supply and a low frequency supply), each attached to one electrode. Filtering is employed to minimize the interaction between the two signals, for example using an inductor that grounds the top electrode at a KHz signal, while appearing to be a high impedance for a MHz signal. Similarly, a capacitor is used to ground the lower electrode for high frequency signals. Alternative configurations include triode or confined arrangements where the plasma is confined within a specific radial geometry and a further arrangement where both supplies are connected to the same electrode can also be employed. In all cases the substrate, and therefore necessarily the associated substrate handling components such as pins and lifters, coolants, sensors etc., are RF driven so coupling to the outside world needs to be sympathetic to those environments. This results in added engineering complexity-adding inevitably to cost.

To a fair approximation, in a dual frequency capacitive system the high frequency power controls the plasma density; due to the higher currents more efficient displacement current increasing the ohmic power into the plasma and sheath heating mechanisms. The low frequency excitation influences the ion bombardment energy. Therefore, the user has some ability to separately adjust the ion bombardment energy and the plasma density, which is not very easy with a single excitation frequency. Reactors of this design have found applications in both PECVD (plasma enhanced chemical vapor deposition) and plasma etching.

Most known systems use a single electrode through which power may be introduced to the plasma region. US 2004/0168770, U.S. Pat. Nos. 6,962,664 and 6,884,635 all assigned to Tokyo Electron Limited (TEL) describe the use of a segmented electrode structure that has a plurality of electrode segments, each segment having a RF power supplies coupled thereto. A control system is configured to dynamically change impedances to match the plasma load impedance. These arrangements are specifically arranged to minimize any interaction between electrodes thereby implying that the electrode elements are in phase with one another. In all cases however there is still a net current introduced into the plasma which at high operational frequencies can cause wavelength effects in the electromagnetic power distribution, resulting in non-uniform voltages and currents, and non-uniform power deposition into the plasma, and resultant non-uniform processes (etching and/or deposition) on the substrate surface.

Despite these advances in reactor design a number of problems still exist. These include the mentioned wavelength effects which cause voltage non-uniformities and introduce currents in the plasma parallel to the electrode surfaces, and under these conditions there is also non-uniform power deposition, which may be expected to produce non-uniform plasma density which degrades the performance of the plasma.

There is therefore a need to provide a plasma source which is configured to overcome these and other problems.

SUMMARY

These and other problems are addressed by a plasma source in accordance with the invention. Such a source, according to a first embodiment of the invention provides a plurality of adjacent electrodes, each electrode being out of phase relative to its adjacent neighbour.

The electrodes can be configured in any one of a plurality of different geometrical configurations including for example planar, hemispheric, dome, convex, concave and/or undulating. The electrodes could be provided so as to be in direct contact with the generated plasma. Using an arrangement in accordance with the present invention it is possible to control the relative centre to edge power deposition by modifying electrode spacings and/or power distribution design and/or the inclusion of active elements such as capacitors and/or inductors.

The invention therefore provides a plasma source according to claim 1 with advantageous embodiments being detailed in the dependent claims. The invention also provides a method of operating a source in accordance with claims 46 and 47, with advantageous embodiments provided in dependent claims thereto. The invention also provides a methodology for coupling RF power to an electrode assembly as claimed in claim 51 with advantageous embodiments provided in the dependent claims. Also provided in an embodiment is a re-entrant probe as detailed in claims 44 or 45. The invention also provides a plasma source substantially as hereinafter described with reference to the following drawings.

These and other features of the invention will now be described with reference to exemplary embodiments of the invention.

DETAILED DESCRIPTION OF THE DRAWINGS

Figure 1:
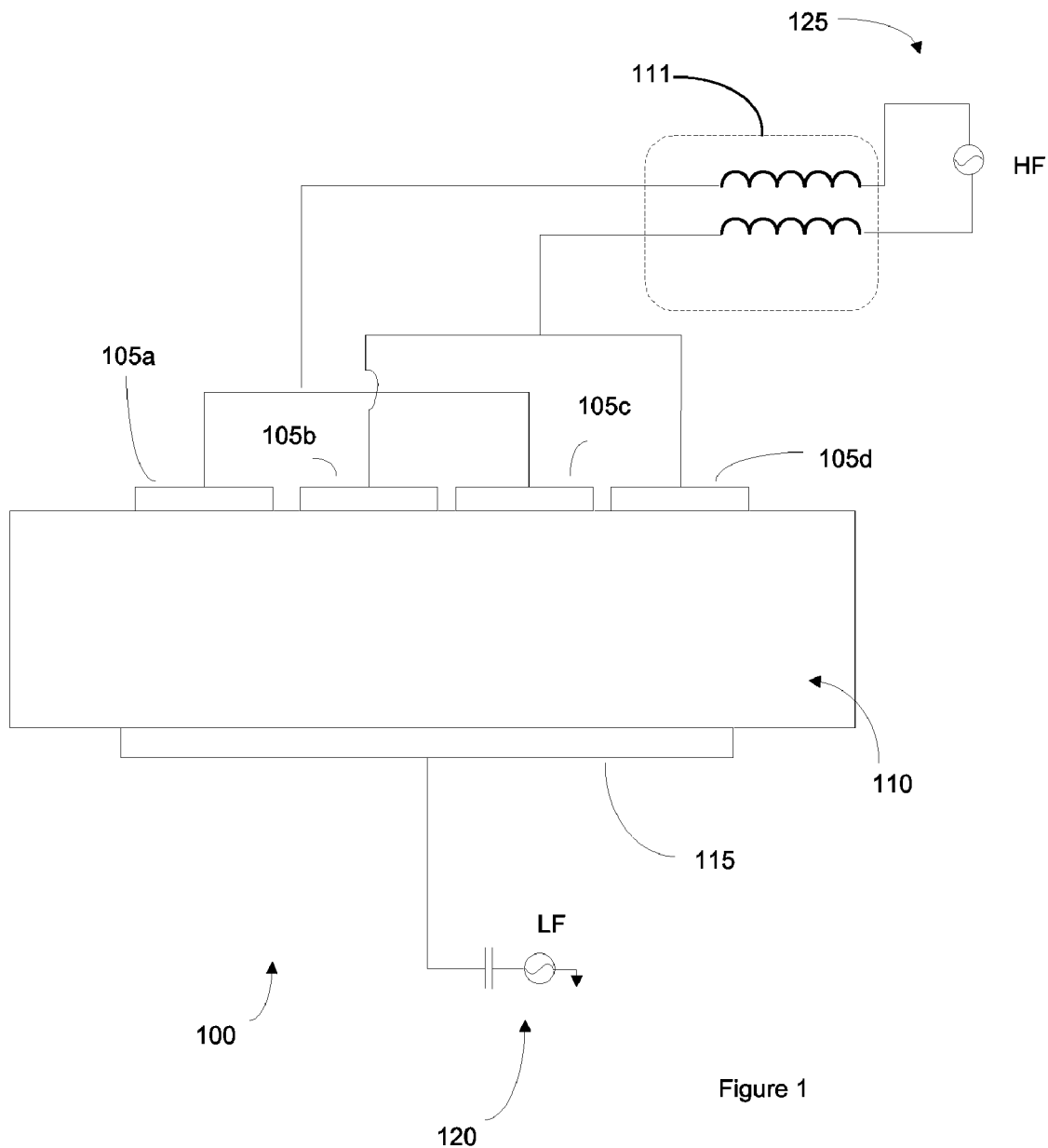
FIG. 1 is a schematic showing an illustrative embodiment of the invention.

FIG. 1 shows a schematic of operational components of a plasma source 100 in accordance with an embodiment of the present invention. The source 100 includes a plasma excitation region 110, into which a process gas may be introduced. This region defines the ultimate plasma volume and it is within this region that the gas is converted into a plasma, which is then used to process workpieces placed within the region. A plasma exciting reactive impendence element 105 is provided above the excitation region 110. This element is coupled to a high frequency (HF) generator or source 125, the application of which to the element being used to control density of the plasma. Within the present description the term high frequency is intended to encompass electromagnetic radiation provided in the range 10 MHz-300 GHz, which sometimes would be referred to as frequency in the radio-frequency to ultra-high frequency range. A reference electrode 115 is displaced below the region 110 and is optionally coupled to a low frequency (LF) source, the application of which is used to control the energy of the ions striking the surface (as per present state-of-the-art). Typical values for a low frequency generator for use with a source of the present invention is one that gives an output in the range 75-460 kHz—exemplary generators include those supplied build by ENI and RFPP and Advanced Energy. Within the context of the present invention a low frequency source is one that dominantly drives ion energy and results in a capacitive voltages on the sheaths. Where the low source is operable in combination with the high frequency source it is desirable to be able to differentiate between the two and therefore an order of magnitude separation between the frequency of operation of the low frequency and the high frequency is sufficient. The LF is intended to have sufficiently lower plasma current such that the ohmic power deposition—$I^2R$—is small in comparison to the HF power. Then, the LF contribution is dominately in the voltage on the electrodes. It will be appreciated that certain applications may desirably provide for two or more LF section in series, for example one at 13.56 MHz, the other at something like 300-800 kHz.

The reference electrode provides a mount for the workpiece (not shown), which is typically a semiconductor, dielectric or metal substrate. The application of suitable fields to the elements 105, 115 serves to generate and maintain the correct ratio of ions and radicals relative to neutral species in the plasma and a control of the energy of the ions incident on the workpiece; gas transport and the residence time of these particles in the excitation region play an important role. This control is required to ensure a correct methodology for the selected deposition or etch processes being employed.

In accordance with the present invention, the reactive element is fabricated from a plurality of individual electrodes, shown in this example as four electrodes 105a, 105b, 105c, 105d, the four electrodes combining to form two sets of electrodes 105a/105c and 105b/105d. Desirably, an even number of electrodes are provided and each of the electrodes is individually coupled to the high frequency power supply which is configured to provide a differential signal to adjacent electrodes. In this manner the signal applied to a first electrode 105a is out of phase with the signal applied to its immediate neighbour 105b. Similarly electrode 105b is out of phase with electrode 105c and electrode 105c is out of phase with electrode 105d. In this way it can be considered that the high frequency generator or drive creates a differential between sets of electrodes. By the very nature of inductive coupling, wavelength effects will be present in the electrodes and the plasma but the multiple electrodes that make up the reactive element of the present invention are advantageous in that the wavelengths effects can be controlled so as to yield the desired plasma density as opposed to the traditional single electrode problem of non-uniform effects. The dimensions of the individual electrodes are chosen and optimized such that non-uniformities on the scale-length of the electrode size that occur adjacent to the reactive elements do not result in excessive plasma non-uniformity at the substrate. It will be appreciated that these dimensions may vary depending on the specific application for which the plasma source is used but desirably the size of each of the individual electrodes is less than or equal to the distance between the source and the substrate or workpiece and is such as to provide uniform effects, if so desired for the particular application. A transformer 111 may optionally also be included if there is a requirement for the equalisation of currents.

The plurality of electrodes provided by the source of the present invention enables a control of the net current induced into the plasma volume. It will be appreciated that at high frequencies any net current introduced into the plasma volume may be reflected through wavelength effects into voltage asymmetries on the surface of the workpiece. This is not advantageous. Through effective coupling of currents into neighbouring segments it is possible to reduce the sum of the net current introduced into the plasma volume so as to obviate these wavelength effects at the workpiece. In an array architecture, where a plurality of segments are divided into sets of similarly configured in-phase electrodes, each of the sets may introduce a net current into the volume, but the combination or sum of the net currents introduced will be reduced by substantially cancelling each other. Such cancelling is achieved by driving different sets out of phase with one another, the net effect being that any phase effects introduced by one electrode set are cancelled by that of another.

Figure 2:
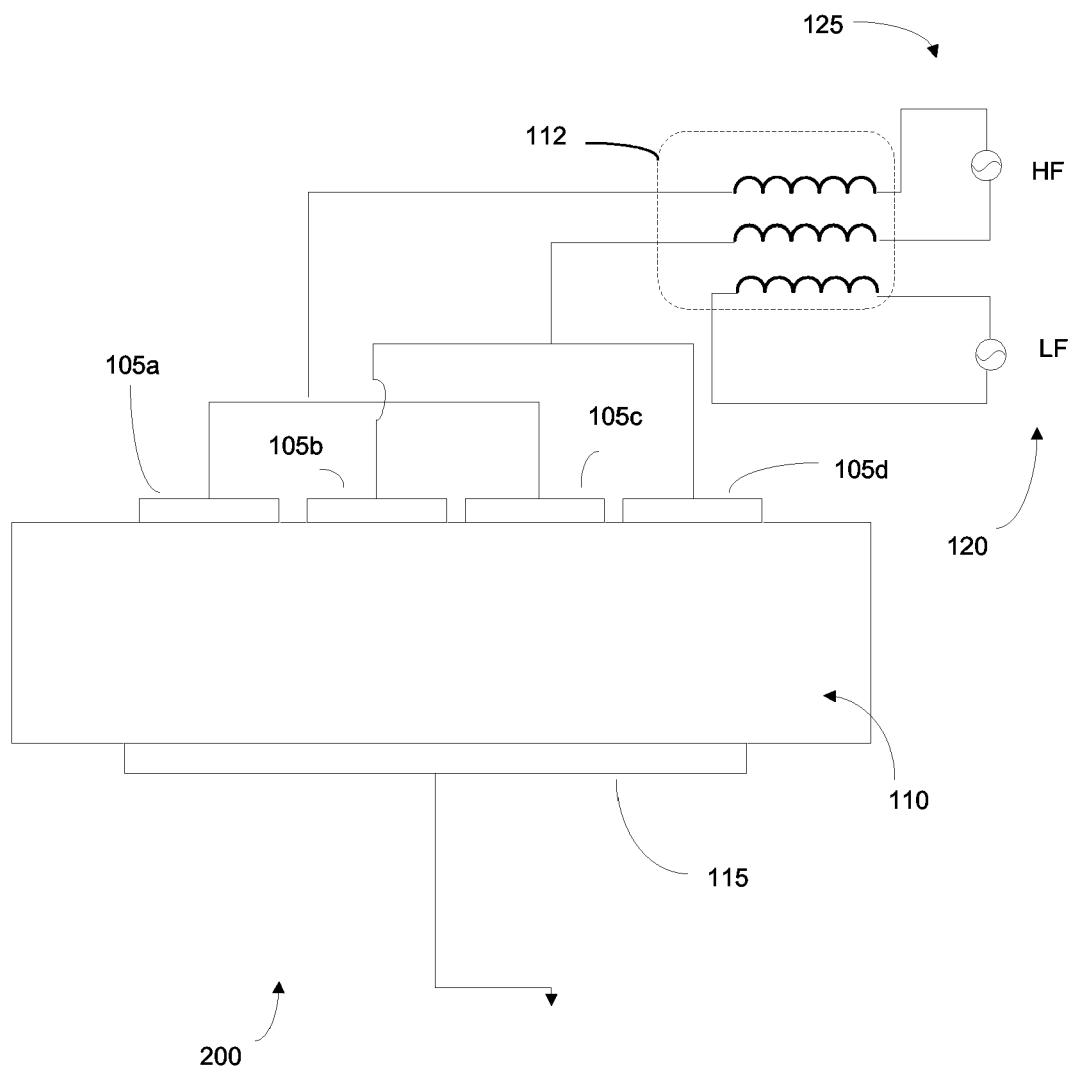
FIG. 2 is a modification to the system of FIG. 1 showing an alternative coupling arrangement for the LF power supply.

FIG. 2 shows a plasma source 200 which is a modification to the arrangement of FIG. 1 where both the LF and HF supplies are coupled to the reactive element. In this embodiment, the HF generator and the LF generator may be applied simultaneously or independently of one another. By coupling both generators to the same reactive element plate it is possible for the lower electrode, the reference electrode, to be grounded. It is not necessary to provide a capacitor in this path to ground (i.e. the reference electrode can be directly coupled to ground), and this arrangement of enabling the reference electrode to be grounded is highly advantageous in that the engineering requirements for the chamber are simplified. For example, in arrangements where a moveable bottom stage was provided it was traditionally necessary for the bellows that make up that moveable stage to define an unknown and variable impedance path; with the grounding of this lower stage, this is no longer a requirement. It will be appreciated that using techniques known in the art that the effect of the LF output can be maximised in the region of interest by confining the plasma volume. This can be achieved in a variety of ways such as for example quartz confinement rings.

The LF supply can be provided in either a differential or a common mode. In a differential mode, with the low frequency signal applied to a first electrode being out of phase with that provided to its immediate neighbour, the ion energy is provided on the reactive element electrodes or on a dielectric material coupled thereto. If the LF supply is provided in a common mode, then greater ion energy is provided on the reference electrode, and a net current is introduced into the plasma volume. This driving of the plurality of electrodes making up the reactive element in a common mode configuration therefore controls the ion bombardment onto the workpiece that is mounted on the reference electrode. It will be understood that differential mode results in lower ion energy to the substrate (reference electrode) but maintains high ion energy to reactive elements for sputtering material and/or keeping electrodes clean from deposition. Similarly to that described with reference to FIG. 1, a transformer 112 may optionally be provided for coupling LF either in common mode or differential mode. Furthermore, the illustrated methodology used for providing LF will be appreciated as being exemplary of the type of methodology that could be implemented as it will be appreciated that other techniques such as for example, low pass filters or LF match-box components connecting LF power to the HF lines, could be used to couple LF power into the system.

The generators or supplies can be operated in either VHF or RF modes, with the difference being that in VHF mode the high frequency will couple inductively whereas in RF mode, it will be coupled capacitively. The ability to change frequency enables one to control the transfer from an inductive discharge to a capacitive discharge, so that one can go from high to low frequencies and vice versa without resultant non-uniform etch (or whatever surface treatment is being provided using the plasma treatment) profiles resulting on the workpiece, as would happen if a single electrode were utilised as in the prior art arrangements. Although the actual frequency at which the inductive discharge becomes predominant is not exact, it is thought that at frequencies of about 500 MHz, that the plasma discharge is predominately inductively based.

Figure 7A:
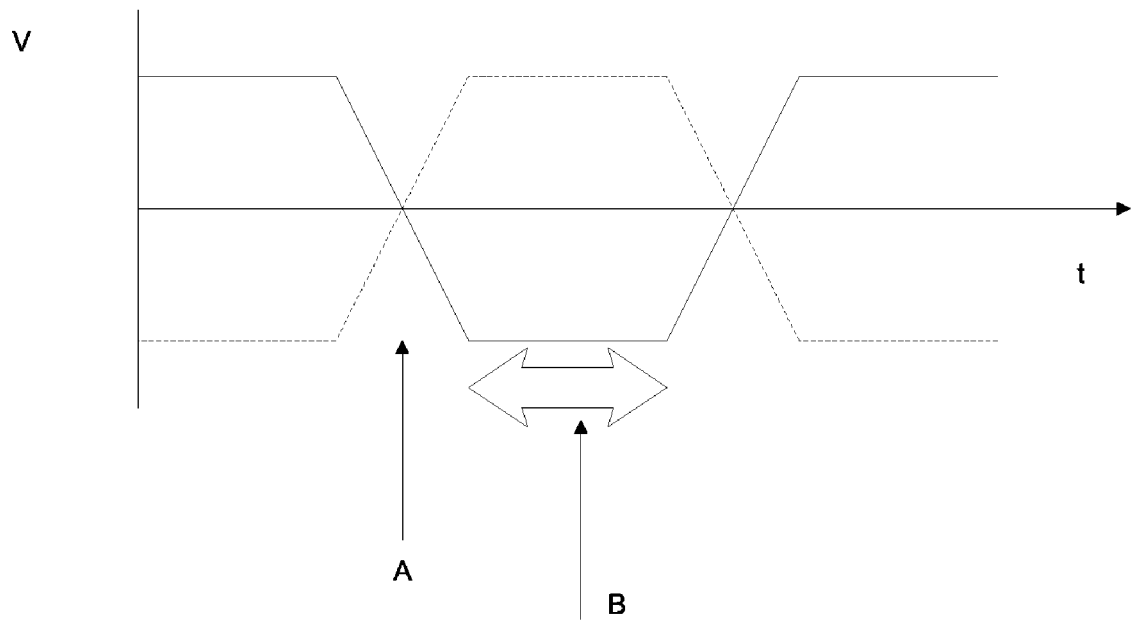
FIG. 7 shows an example of a switching sequence for use in operation of a source in accordance with the teachings of the invention.
Figure 7B:
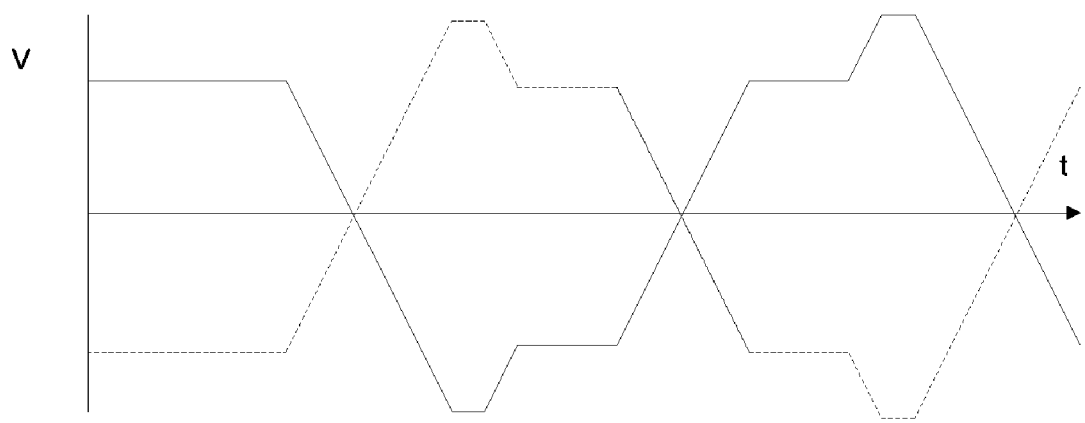

In a modification to that described heretofore, the present invention also provides for the HF source to operate in a switch mode as opposed to a sinusoidal operation. Such a switch mode operation is advantageous in that it is possible to alter the slew-rate of the switch region so as to yield an "effective frequency" which will determine amount of inductive coupling. The length of time the reactive element is left in the high voltage state, i.e. a plateau region, would control the ion bombardment energy of the upper electrode—and if the source is used in a confined arrangement, the lower electrode. The choice of the value of the high voltages is useful in that it controls ion impact energy and assists in keeping the upper electrode clean. Control of the period between ramp ups, i.e. between switching, gives you control over the power deposited into the volume. Switch mode generators are very well known in the general electronics field with well defined characteristics and components. The ability to use such a switch mode generator provides for a reduction in cost of the plasma source-switch mode generators are cheaper than the equivalent sinusoidal based generator. By controlling the slew rate one is able to move easily from the RF range to Ultra High Frequencies (UHF) thereby providing the possibility to tune the process chemistry and/or the electron temperature, $T_e$. An example of the type of switch mode operation is shown in FIG. 7 where it is shown on FIG. 7a that a planar plateau region may be provided having relatively constant high or low voltage signals whereas in FIG. 7b, a multi step arrangement is provided. The switch region is marked as "A" and the plateau region is "B". The "A" region may also be considered as an overshoot caused by reactive elements between the voltage switch and the electrode which can be designed for and controlled.

Figure 9:
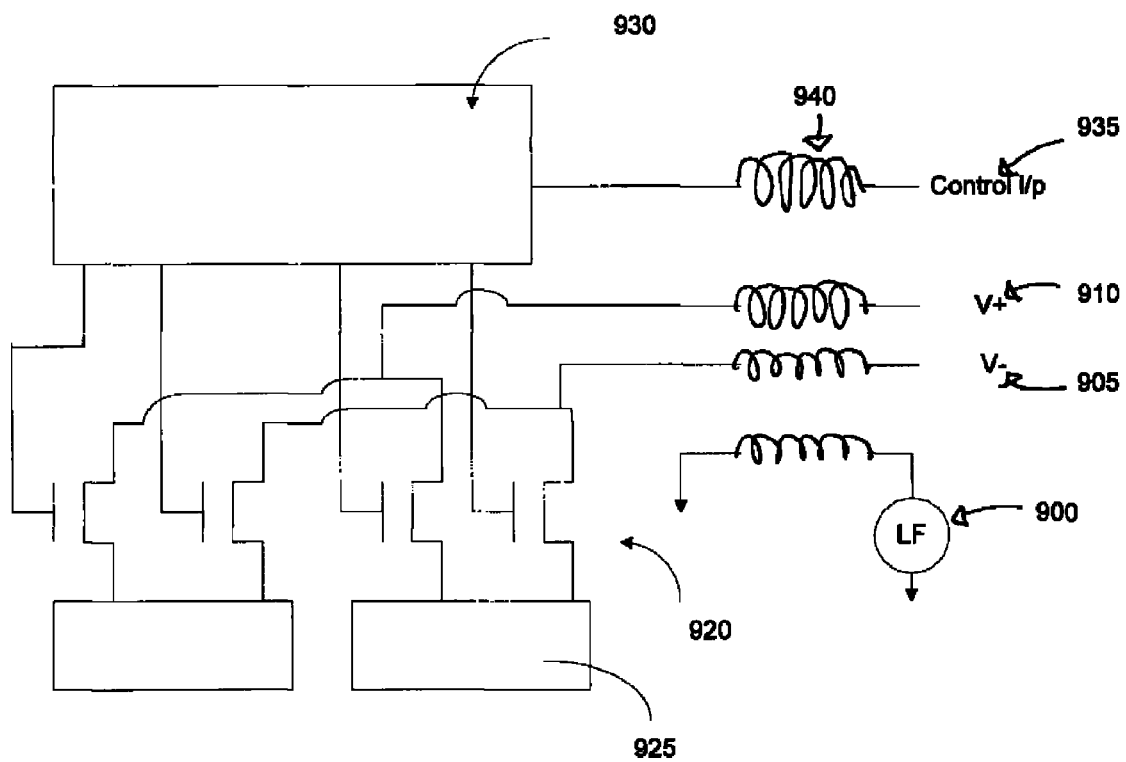
FIG. 9 is an example of the type of circuit that may be used to use switches to provide the high-frequency power in conjunction with coupling a LF generator to two or more of the electrodes.

FIG. 9 shows an example of the type of circuit configuration that may be used in providing such a switch mode operation. In this arrangement a LF generator 900, a negative supply 905 and a positive supply 910 are all switchably coupled via one or more field effect transistors (FETs) 920 or some other switching elements to one or more of the electrodes 925. It is optimum that any switch used is a high speed switch. The electrodes can be individually coupled to the respective supplies or can be grouped in sets of electrodes which will all be switched at the same time. A FET driver element 930 is coupled to the FETs to control the switching and the selected ones of the electrodes to be switched is determined by a control line 935. In the embodiment illustrated in FIG. 9, the control line is coupled, (in a similar fashion to the LF supply, the positive supply and the negative supply) via a coil of a transformer 940 to the FET driver. In another embodiment, where for example the control line is provided as an optical feed, it may be coupled directly to the FET driver.

Figure 3:
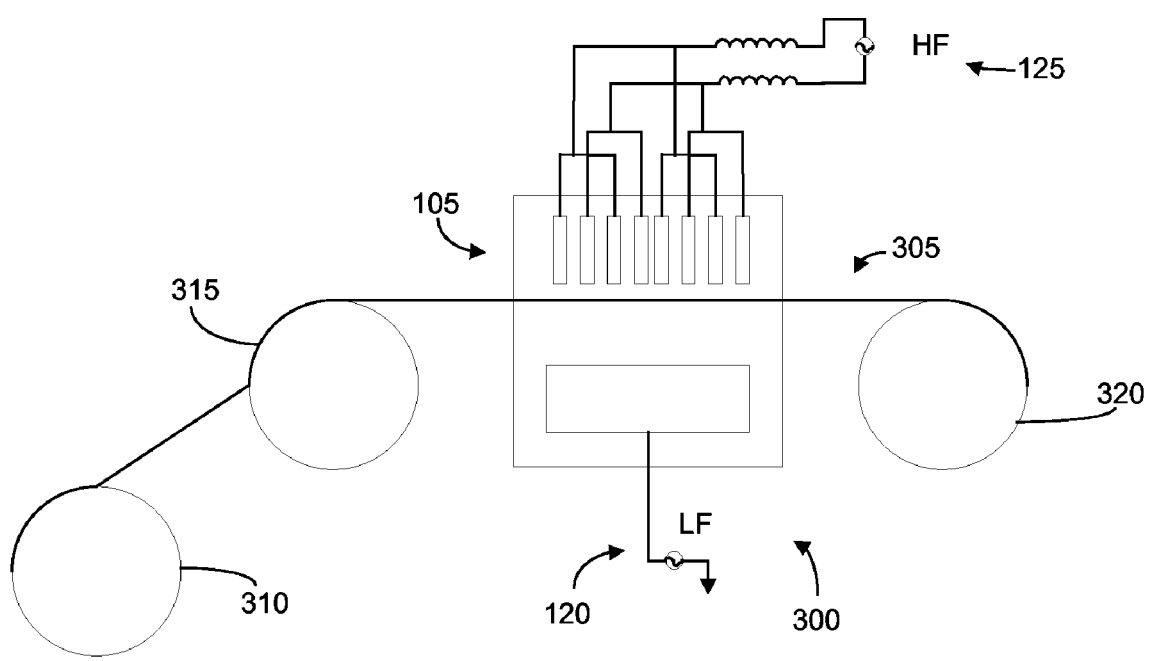
FIG. 3 shows, in schematic form, an arrangement for using the plasma source of the present invention with a roll of film.

Heretofore, the invention has been described with reference to a plasma source configured to operate with a planar workpiece, where the electrodes making up the reactive impedance element and the reference electrodes are substantially parallel to each other and to the workpiece. Such arrangements are advantageous and useful for application in the semiconductor environment where a planar wafer is provided for etching. However it is known that plasma sources can also be used in other applications where it is desired to process a non-planar substrate, for example a roll of film in a textile screen printing application. FIG. 3 shows in schematic form how the present invention can be configured for use in such an arrangement 300 where a roll of film 305 is originally provided on a reel 310. The film is unwound from the initial reel 310 on an unwind station 315, passes through the plasma source 105 where it is processed and is re-wound on a rewind station 320. The plasma source of the present invention is suitable for processing such large dimension surfaces because the multiple electrodes that make up the reactive element enable the provision of uniform plasma over an extended area. The arrangement of the present invention allows for the provision of higher frequency sources to be used and therefore the speed of the film through the plasma source can be increased. These higher frequencies do not lead to a detraction in the quality of the plasma as the multiple electrodes of the reactive element provide for higher density application without detracting from the uniformity of the applied plasma. It will be appreciated that such an arrangement may also be modified for plasma screens, LCD displays, industrial coating on metal/glass, and the like where simultaneous processing of large areas is required. Although the LF supply shown in this embodiment is coupled to the substrate plate it will be understood that in a manner similar to that described with reference to FIG. 2 that one could also have a low frequency feed through the upper reactive elements. A feature of the present invention is that the source can also be extended in the direction of travel of the material. Thus the amount of plasma treatment of the surface (etching, deposition, modification of surface properties, etc.) can be controlled by the physical extent of the plasma source. This further enables the integration of multiple processing steps where the amount of processing being done by the different steps may be individually optimized. For example if the material being processed has a velocity of 1 m/min and passes through two sequential plasma source areas with physical length of 25 and 50 cm, the active processing time for the two sources would be 15 and 30 seconds, respectively. In this way an electrode arrangement in accordance with the teachings of the invention may be provide in two dimensions with the second dimension enabling a movement of the substrate through the reaction volume, enabling a continuous processing of a web as it travels through the source.

Figure 4:
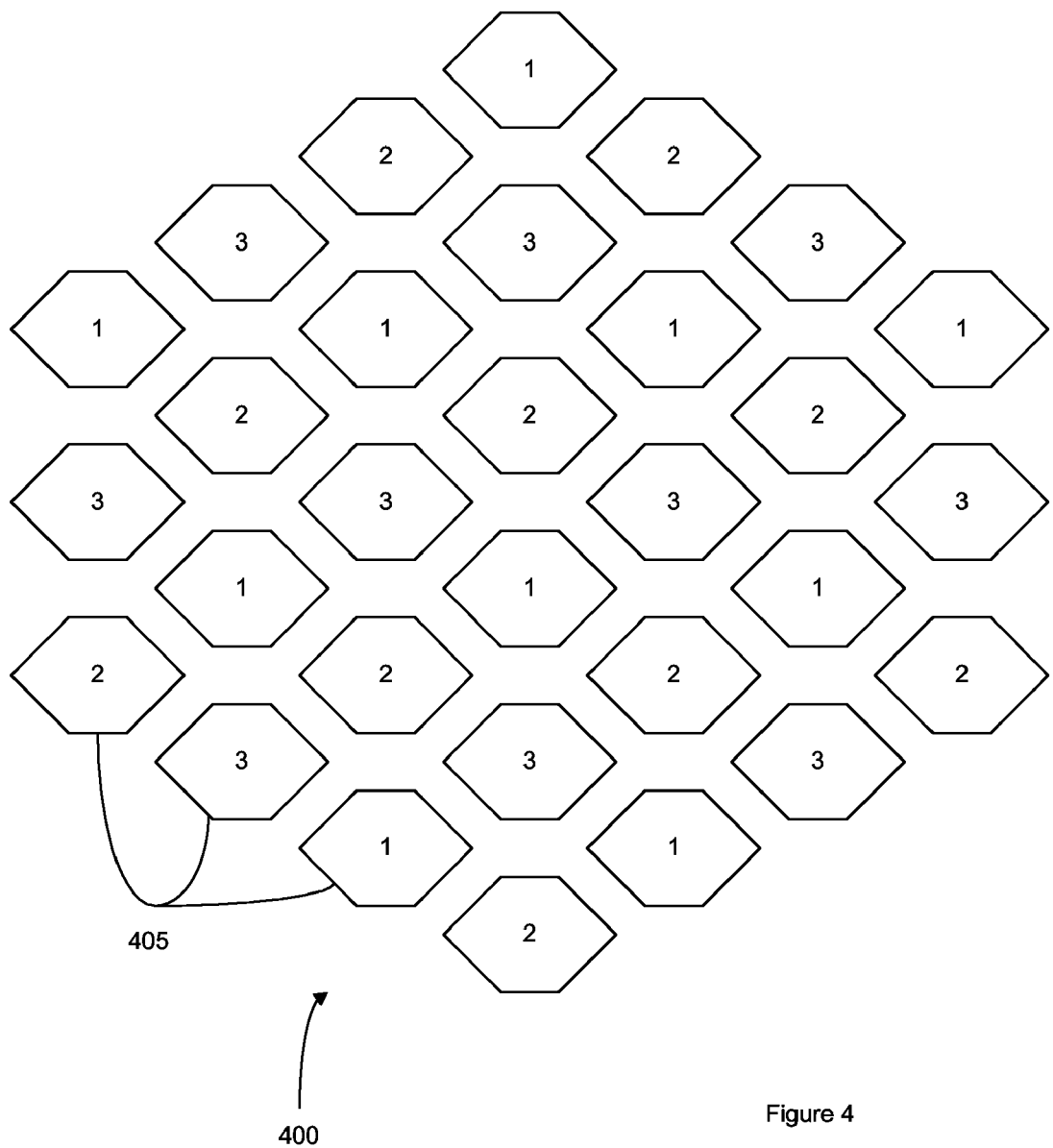
FIG. 4 is an example of an electrode arrangement that can be used in a triphase powering arrangement.
Figure 5:
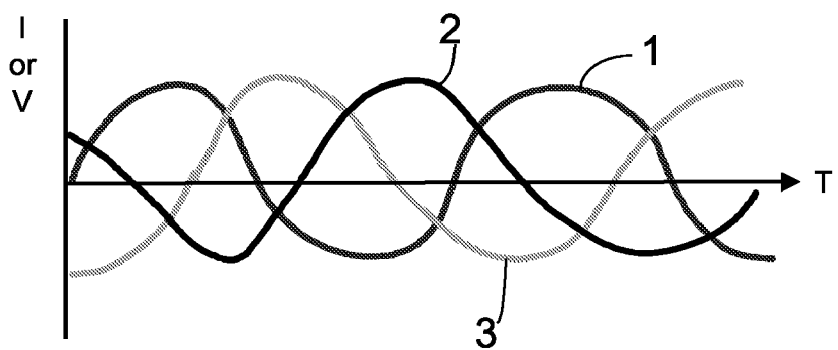
FIG. 5 shows a typical arrangement for the phase differences between three supplies for use with the electrode arrangement of FIG. 4.

Certain applications may require the use of a curved processing area. The present invention provides for such processing in one of two ways. In the first, in a manner similar to that described with reference to FIG. 3, the invention utilises a substantially planar arrangement of reactive elements to process a curved workpiece. FIG. 4 shows an alternative arrangement in accordance with the teachings of the present invention, where the source could be applied to non-planar plasma volumes. In this example it may be advantageous to provide an electrode configuration that can be configured in a non-planar configuration-either by arranging planar electrodes in a non-planar geometry or providing non-planar electrodes. The example of FIG. 4 shows the former arrangement where a plurality of planar electrodes are arranged in a hexagonal close pack configuration 400 including a plurality of individual hexagonally dimensioned electrodes 405. In this example, a 3 phase drive mechanism is used as opposed to the direct push pull operation of the configuration of FIGS. 1 to 3, and each of the individual electrodes is coupled to a respective one of the three sources (identified by the labelling 1, 2, 3 respectively). As with the embodiment of the previous Figures, no two adjacent electrodes are in phase with one another—see FIG. 5 for an example of the output configuration for each of the sources. To assist in current balance a tri-filar transformer may be used which is advantageous in that it allows for the provision of a low voltage above the substrate and an equalisation of the currents. In other circumstance, it will be appreciated that certain applications where it is useful to drive a net current and therefore a net voltage intro the reference electrode may find it advantageous to have an element of current imbalance. It will be further appreciated that the examples of two and three phase sources are exemplary of the type of frequency generator that could be used with the reactive elements of the present invention and that certain other applications may require sources capable of providing a higher order phase supply.

Figure 8:
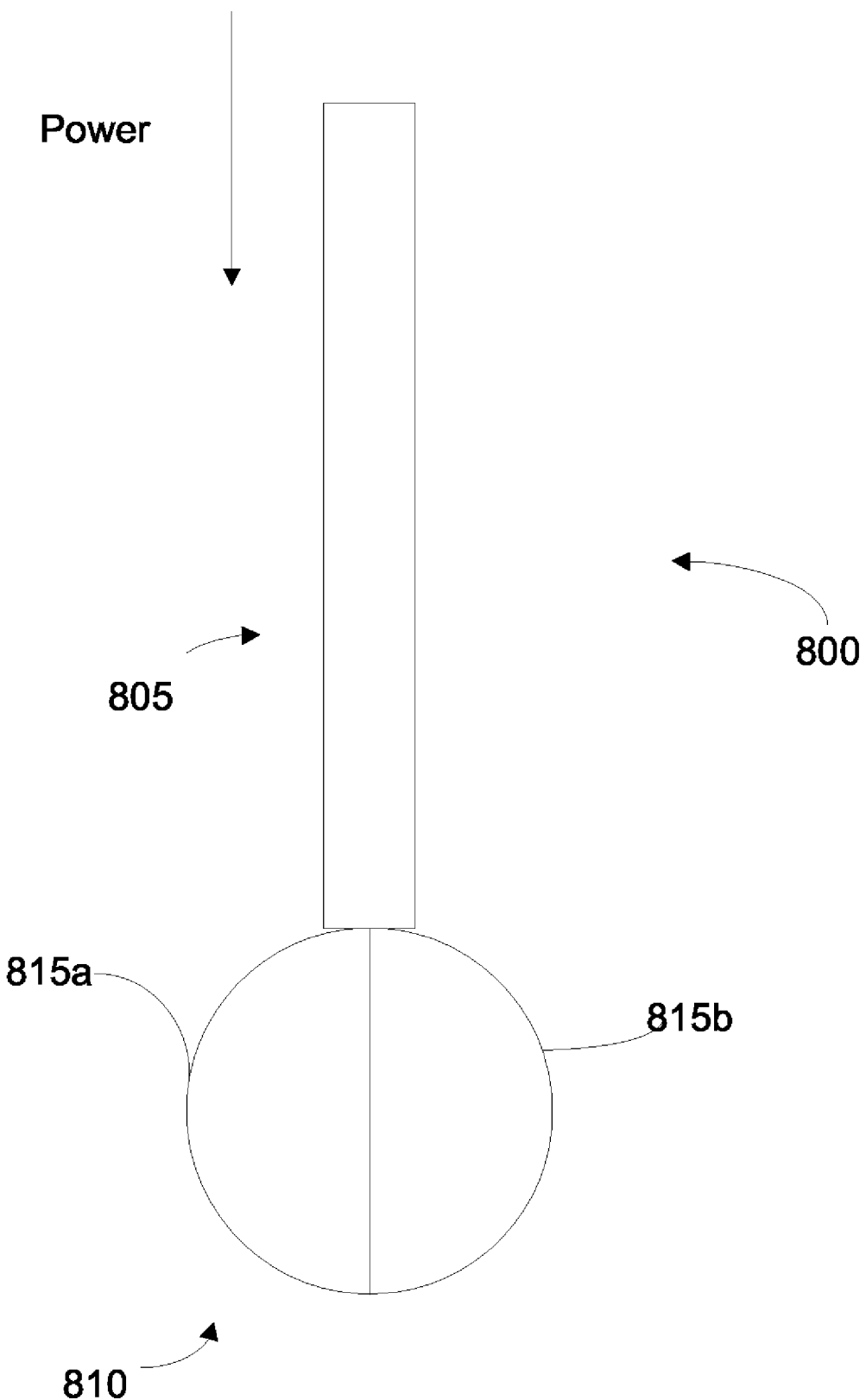
FIG. 8 is a schematic of a re-entrant probe in accordance with the teachings of the invention.

Geometries enabled by the electrode arrangement of the present invention may be used to provide re-entrant probes such as that shown in FIG. 8. In this exemplary embodiment of a re-entrant probe 800, an electrode structure 805 is provided at the end of a wand 810. The wand is used to insert the structure 805 into confined areas so as to enable an application of a plasma coating to internal surfaces for applications such as bottle coatings, treatment of automotive and aeronautical parts and other components that are not suited to conventional plasma applications. In an RF re-entrant probe provided by the invention, the RF may be provided locally at the electrode structure or could be generated externally to the probe and transmitted down the wand to the structure. Where the structure is provided as a spherical geometry, the electrodes could be arranged for example in the form of two distinct segments 815a, 815b arranged in a hemisphere arrangement or a plurality of a segments arranged about the surface of the sphere, somewhat similar to a dimple arrangement on a golf ball. The description of a re-entrant probe with reference to a spherical geometry is not intended to be limiting in that any re-entrant probe that is implemented with a plurality of electrodes powered at high frequency is intended to be encompassed within the context of the present invention.

Figure 6:
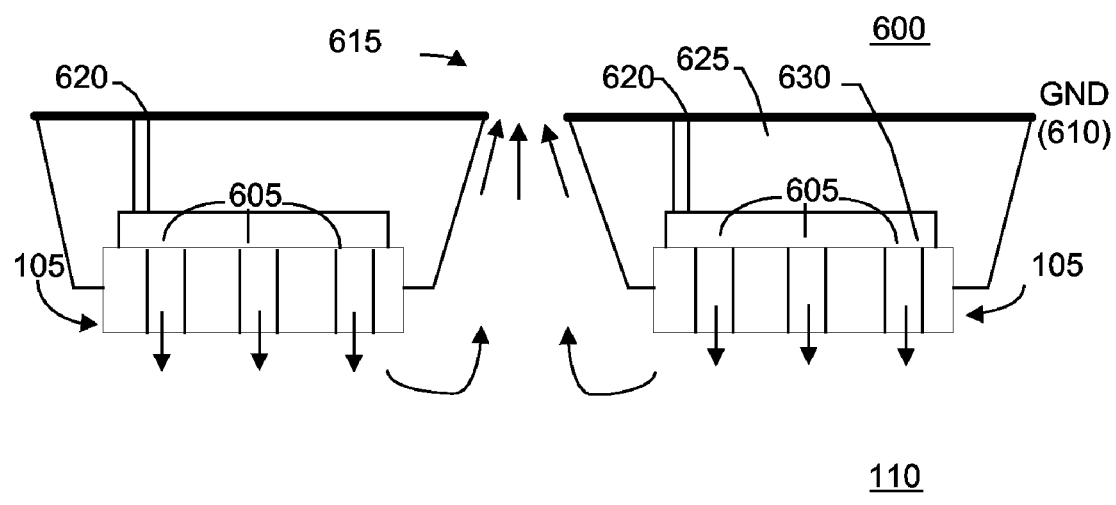
FIG. 6 shows an alternative pumping arrangement for introducing and pumping of gas in the plasma chamber according to the present invention.

Although the plasma source of the present invention may be used with known gas distribution feeds such as a shower effect electrode with radial gas flow and pumping on the perimeter of the plasma volume, the present invention also provides in certain embodiments sources that utilise a gas distribution feed that enables the removal of gas away from the lower reference electrode. FIG. 6 shows a portion of such a source where two adjacent electrodes that make up the reactive element are illustrated. The electrodes are mounted below a gas feed chamber 600, and the gas that is within this chamber may be introduced firstly to a feed chamber 630 through an entrance conduit 620 and then into the plasma excitation region 110 through a plurality of apertures 605 provided in the electrodes of the type that will be known to those skilled in the art from existing showerhead technology. Once the gas has entered into the excitation region 110 it then flows towards a ground plate 610 providing a gas exit 615 above the electrodes into a pumping plenum 620. The pumping plenum is electrically isolated from the plasma volume thereby obviating the possibility of the plasma reforming in this region. This pumping of the gas away from the excitation region obviates the possibility of the etchant gas interacting with the substrate being treated on the reference electrode. It may be necessary in this arrangement where the gas is moved around the electrodes to coat the electrodes with a dielectric material 625 such as silicon dioxide or the like. Such a dielectric coating is shown as defining the exit path for the gas, but the exact extent of the coating could vary depending on application.

It will be appreciated that what has been described herein is a new plasma source which provides for centre-to-edge power deposition by electrode spacing and/or power distribution design and/or active elements such as capacitors and/or inductors so as to provide for a controlled uniformity profile plasma. In certain applications this can require a difference in the profile of the plasma at certain regions of applications, such that specific selected areas are regions of greater plasma deposition as opposed to other. Other applications may require the same profile across the substrate. Although, the electrodes have been described with regard to exemplary embodiments it will be appreciated that the configuration chosen for a specific application can be such so as to have the electrodes arranged on any arbitrary—shape plasma facing element including for example flat, hemispheric, dome, convex, concave, undulating. The electrodes could be in direct contact with the plasma or could alternatively interact with the plasma through a dielectric window provided from materials such as SiN, AlN, SiC, $SiO_2$, Si etc. The arrangement of the present invention provides a number of distinct advantages over the prior art including:

Compatible with HF+LF independent control of ion energy ($E_{ion}$) and ion flux ($\Gamma_{ion}$).

The ability to scan from RF to UHF allows a new dimension in plasma control, namely control of the plasma chemistry independently from the plasma density and ion energy.

As the individual electrodes making up the reactive element may be dimensioned small, and the dimensions of these can define the plasma volume it is possible to provide a plasma source having a small plasma volume. Any individual non-uniform power coupling from an individual electrode or pair of electrodes does not result in non-uniform plasma density at a large enough distance from the electrodes. Specifically, it will be understood that as each of the individual elements are reduced in size that the distance required within the plasma volume for the overall generated plasma to be equalised is reduced. The source may be used with substrates of many different dimensions as it may be configured to provide minimal centre-to-edge power deposition effects over an extended area and as such is suitable for large substrates (300 mm wafers, FPD, textiles and the like). This enables simplified process scaling from one size substrate to another.

Similarly, the possibility of using high frequency sources is advantageous as one can choose the operational frequency to match the process required, and it is possible to go to higher frequencies than heretofore achievable without introducing plasma non-uniformity.

The source may be used with gas distribution feeds similar to present generation systems or alternatively may be used with a distribution feed that minimizes any interaction between etchant or deposition by-product gas and the substrate material.

Reduced system cost as lower electrode can be grounded. This is particularly advantageous in that there is no longer a requirement to provide a high frequency lower plate, which had the requirement that ancillary equipment needed to be isolated from ground, whereas the configuration of the invention enables the ancillary equipment to be grounded.

Compatible with advanced HF power supply technology and direct-drive switch-mode power, which can provide the necessary frequencies at a lower cost. No HF through lower electrode, so variable gap easier to engineer. As the HF component is applied to the reactive elements solely it is possible to minimize the HF return through chamber body, so unconfined plasma should be less likely to occur. Furthermore, there is no longer the requirement to stringently provide for such HF paths in other components of the chamber.

It will be understood that the invention provides for plurality of physically individually distinct reactive elements with adjacent electrodes being coupled out of phase with one another. It will be appreciated that if two adjacent electrodes are couple in phase with one another that they in effect resemble a physically larger single electrode, and that such a single larger electrode will be out of phase with its immediate neighbours.

The reactive elements of the invention may be provided in any configuration or array structure, for example a 2-D array or linear structure which may, it will be appreciated, be scaled in dimension depending on the application required. It will be appreciated that the configuration of the present invention provides for such scaling while maintaining compatibility with VHF/UHF operation requirements and performance levels.

It will be understood that what has been described herein are varying modifications to a plasma source that uses a plurality of electrodes as opposed to a conventional single electrode approach. By implementing a source in accordance with the teachings of the invention it is possible to provide a lower cost per wafer, have higher yields for etch and for chemical vapour deposition (CVD) in semiconductor and flat panel manufacturing processes and is scaleable to larger than 300 mm wafers and for use in large format displays. Such advantages and others are possible for a variety of reasons including the fact that there is greater control of the plasma through driver control and through gas pumping arrangements, a reduction in edge effects and by enabling plasma generation using a low plasma volume.

There are a number of different technologies where use of a plasma source in accordance with the teachings of the invention has benefit. These include plasma etch, CVD, and modification. The latter application, modification, is where a processing of a substrate using plasma techniques may be used to effect changes in the surface properties of the substrate. This may be achieved by changing the physical and/or chemical properties of the surface without a (substantial) deposition or removal of material. For example, one can make a surface hydrophobic or hydrophilic simply by changing the dangling bonds on the ends of the lipids—for example making wool absorb water so that water-based dyes can be used. Sometimes modification is called 'functionalizing' and/or 'passivating'. Within each of these three technology headings there are a variety of applications that could be suited to the plasma source of the invention. Such applications include plasma etch wafer fabrication equipment, the use of plasma etch in the production discrete display substrates and discrete photovoltaic substrates, plasma etch in the production of roll to roll photovoltaic substrates, CVD used with discrete substrates such as photovoltaic, architectural glass, aerospace coatings, medical devices, automotive applications and CVD used in roll to roll applications for example for use with paper, metals, fabrics and plastics.

Therefore although the invention has been described with reference to exemplary illustrative embodiments it will be appreciated that specific components or configurations described with reference to one figure may equally be used where appropriate with the configuration of another figure. Any description of these examples of the implementation of the invention are not intended to limit the invention in any way as modifications or alterations can and may be made without departing from the spirit or scope of the invention. It will be understood that the invention is not to be limited in any way except as may be deemed necessary in the light of the appended claims.

Similarly, the words comprises/comprising when used in this specification are to specify the presence of stated features, integers, steps or components but does not preclude the presence or addition of one or more other features, integers, steps, components or groups thereof.

The invention claimed is:

1. A plasma source comprising a plasma excitation region and a plasma exciting reactive impedance element, the source being characterized in that the plasma exciting reactive impendence element includes a plurality of electrodes, the electrodes being coupled to a high frequency generator and wherein, in use, on coupling the electrodes to the generator, adjacent electrodes of the plurality of electrodes are out of phase with one another, the plurality of electrodes are arranged such that any current introduced by a first electrode is substantially canceled by a second electrode, thereby reducing the net current introduced into the plasma excitation region, wherein the high frequency generator is provided in a switch mode configuration to provide a plurality of switches; wherein each switch is coupled to one electrode out of phase with another electrode.

2. The source as claimed in claim 1 further including a low frequency generator, and wherein the electrodes of the reactive impedance element are additionally coupled to the low frequency generator.

3. The source as claimed in claim 2 wherein a selected number of the electrodes coupled to the low frequency generator are operable in a common mode while selected others of the electrodes coupled to the low frequency generator are operable in a differential mode.

4. The source as claimed in claim 3 wherein at least fifty percent of the electrodes coupled to the low frequency generator are operable in differential mode.

5. The source as claimed in claim 2 wherein the low frequency and high frequency generators are operable simultaneously.

6. The source as claimed in claim 2 wherein multiple low frequency generators are provided.

7. The source as claimed in claim 6 wherein the multiple low frequency generators are coupled in series.

8. The source as claimed in claim 7 wherein a first low frequency generator is provided and is operable at 4 MHz and a second low frequency generator is provided and is operable at 75 kHz.

9. The source as claimed in claim 2 wherein each of the low and high frequency generators are configured such that they can be individually applied so as to provide a desired process output.

10. The sources as claimed in claim 2 wherein each of the outputs of the low and high frequency generators are configured so as to provide an output controlling a process parameter that is independent of the process parameter controlled by the other of outputs.

11. The source as claimed in claim 1 wherein the reactive element is configured to enable a gas feed through selected ones of the plurality of electrodes, the gas flow through individual electrodes can be controlled separately, and the gas flow through individual electrodes provides a multiple zone gas feed, thereby enabling different gas chemistry in different regions of the plasma excitation region.

12. The source as claimed in claim 1 wherein the switch mode configuration includes sets of electrodes at the same phase all driven by the same switch.

13. The source as claimed in claim 1 wherein the switch mode configuration provides for a coupling of each electrode to its own switch.

14. The source as claimed in claim 1 wherein the switch mode configuration provides for a coupling of two or more electrodes to a single switch.

15. The source as claimed in claim 1 wherein the switch mode configuration provides a coupling of a low frequency generator to DC feed-lines.

16. The source as claimed in claim 1 wherein selected ones of the plurality of elements are provided with an outer coating selected from a non-conductive or dielectric material.

17. The source as claimed in claim 1 wherein the plurality of electrodes are arranged into two or more sets of electrodes, each set having electrodes in phase with one another, and wherein each of the sets are arranged so as to effectively cancel any net current introduced into the plasma excitation region by other sets.

18. A re-entrant plasma probe comprising:
a plasma excitation region; and
a plasma exciting reactive impedance element including a plurality of electrodes configured for coupling to a high frequency generator with adjacent electrodes of the plurality of electrodes out of phase with one another, the plurality of electrodes configured such that any current introduced by a first electrode is substantially canceled by a second electrode, thereby reducing the net current introduced into the plasma excitation region, wherein the high frequency generator is provided in a switch mode configuration to provide a plurality of switches; wherein each switch is coupled to one electrode out of phase with another electrode.

19. A method of operating a plasma source having a plasma excitation region and a plasma exciting reactive impedance element including a plurality of electrodes configured such that any current introduced by a first electrode is substantially canceled by a second electrode, thereby reducing a net current introduced into the plasma excitation region, the method including steps of:
coupling electrodes of the exciting reactive impedance element to a high frequency generator provided in a switch mode configuration with adjacent electrodes of the plurality of electrodes out of phase with one another; and
tuning the plasma source by tuning the high frequency generator to optimize a specific process output, the tuning enabling a modification of properties of plasma generated until a specific desired process output is realized; and coupling one electrode out of phase with another electrode to a single switch of the high frequency generator.

20. The method of claim 19 wherein the plasma source includes a low frequency generator coupled to the electrodes of the exciting reactive impedance element, the high frequency generator and the low frequency generator are configured to control respective parameters, and tuning the plasma source includes tuning the high frequency generator and tuning the low frequency generator until the specific desired process output is realized.

21. The method of claim 20 further including a step of varying a slew rate of an electrode voltage so as to vary a relative amount of power coupled to the plasma by capacitive and inductive means.

22. The method of claim 20 wherein a period between switches is controlled to control a total power delivered to the plasma.

23. The method of claim 20 comprising selecting a DC rail-voltage to control ion energy.

* * * * *